United States Patent [19]

Umemoto et al.

[11] Patent Number: 4,698,652
[45] Date of Patent: Oct. 6, 1987

[54] FET WITH FERMI LEVEL PINNING BETWEEN CHANNEL AND HEAVILY DOPED SEMICONDUCTOR GATE

[75] Inventors: Yasunari Umemoto, Hachioji; Susumu Takahashi; Yuichi Ono, both of Nishitama, all of Japan

[73] Assignee: Hitachi, Ltd., Tokyo, Japan

[21] Appl. No.: 731,911

[22] Filed: May 8, 1985

[30] Foreign Application Priority Data

May 11, 1984 [JP] Japan ............................ 59-92816

[51] Int. Cl.$^4$ .................... H01L 29/205; H01L 29/80
[52] U.S. Cl. ................................. 357/16; 357/4; 357/22; 357/23.2; 148/DIG. 53; 148/DIG. 72; 148/DIG. 88; 148/DIG. 97
[58] Field of Search ............ 357/23.2, 22 R, 22 A, 357/22 MD, 16, 4

[56] References Cited

U.S. PATENT DOCUMENTS

| | | | |
|---|---|---|---|
| 4,424,525 | 1/1984 | Mimura | 357/16 |
| 4,532,533 | 7/1985 | Jackson | 357/16 |
| 4,559,547 | 12/1985 | Shiraki | 357/16 |

FOREIGN PATENT DOCUMENTS 71335 2/1983 European Pat. Off. .

OTHER PUBLICATIONS

Electronics Letters, vol. 18, No. 4, Feb. 18, 1982, pp. 180–181.
J. Appl. Phys., vol. 54, No. 5, May 1983, pp. 2795–2806.
Thin Solid Films, vol. 130, No. 112, May 1983, pp. 155–166.
Japan J. Appl. Phys., supp. 22-1, 1983, pp. 11–19.
International J. of Electronics, vol. 52, No. 1, Jan. 1982, pp. 13–22.
Electronics Letters, vol. 14, No. 16, Aug. 3, 1978, pp. 500–502.

Primary Examiner—William D. Larkins
Attorney, Agent, or Firm—Antonelli, Terry & Wands

[57] ABSTRACT

Herein disclosed is a semiconductor device in which control means for carriers migrating in a first semiconductor includes an interface state layer lying on the first semiconductor and a second conductor layer lying on the interface state layer. The interface state layer has its Fermi level pinned to that of the second semiconductor layer. By thus constructing an FET or the semiconductor device, an inversion or accumulation layer can be easily formed in the interface merely by applying a voltage to the control means.

13 Claims, 29 Drawing Figures $V_{gs} > 0$ $V_{gs} > 0$ $V_{gs} > 0$

FET WITH FERMI LEVEL PINNING BETWEEN CHANNEL AND HEAVILY DOPED SEMICONDUCTOR GATE

BACKGROUND OF THE INVENTION

The present invention relates to a high-speed field effect transistor.

A MISFET (i.e., Metal Insulator Semiconductor Field Effect Transistor) using a substrate of a compound semiconductor such as GaAs or InP is shown in section in FIG. 1(a). In FIG. 1(a): reference numeral 1 indicates a p-GaAs substrate; letter 2 an n-GaAs layer; letter 3 an insulating film; letter 4 an interface state layer; letter 5 a gate electrode; letter 6 a source electrode; and letter 7 a drain electrode. The MISFET thus composed is a device which is enabled to conduct operations of inversion type. When a positive voltage is applied to the gate electrode 5, more specifically, an electron inversion layer 8 is formed in the interface between the insulating film 3 and the p-GaAs substrate 1. Since the inversion layer is used as a channel, the MISFET has a possibility for a high-speed device. As a matter of fact, however, as shown in the band diagram of FIG. 1(b), there is formed in the interface between the insulating film 3 and the p-GaAs substrate 2 the layer 4 (which will be called the "interface state layer 4") having a thickness of 10 to 30 Å, in which a remarkably high-density interface state of $10^{12}$ to $10^{13}$/cm$^2$/eV is present in the vicinity of the energy gap center of the semiconductor. As a result, the Fermi level $\psi_{SS}$ of the interface state has a strong tendency of being pinned at the Fermi level $\psi_P$ of the semiconductor so that the surface potential $\psi_S$ is not fluctuated even by applying a positive voltage to the gate electrode to make it difficult to form an inversion layer.

Thus, the existing MISFET finds it difficult to use the inversion layer as the channel so that it cannot allow a large current to flow therethrough. This is because the high-density interface state layer is present so that the Fermi level of that interface state has a tendency to be pinned at that of the semiconductor. The MIS transistor described above is disclosed, for example, in T. Ito and Y. Sakai "The GaAs Inversion type MIS Transistors", Solid-State Electronics vol. 17, pp. 751 to 759 (1974).

SUMMARY OF THE INVENTION

An object of the present invention is to provide a high-speed field effect transistor which can allow a large current to flow therethrough.

In order to achieve this object, the present invention basically has the following structure. The field effect transistor of the present invention comprises: control means including an interface state layer on a first semiconductor region having a first type of conductivity, and a second semiconductor layer on said interface state layer; and carrier donating and accepting means sandwiching said control means in between, said interface state layer having its Fermi level pinned to the Fermi level of said second semiconductor layer. Here, the second semiconductor is made of a single crystalline or polycrystalline semiconductor.

The pinning of the Fermi level of the interface state layer to the Fermi level of the second semiconductor is conducted specifically, as follows.

As has been described above, more specifically, the existing MISFET has a strong tendency that the Fermi level of the interface state is pinned to that of the semiconductor. This is because the charge or discharge time of electrons to the interface state from the semiconductor is shorter than that from another region (e.g., gate metal) so that a quasi-thermal equilibrium holds between the interface state and the semiconductor.

This relationship will be described more quantitatively, as follows.

More specifically, the charge and discharge time $\tau_s$ of electrons to the interface state from the semiconductor is within a range of 10 nsec to 10 msec. in case the semiconductor is n-GaAs, for example. Generally speaking, in a compound semiconductor belonging to a III-V group, on the other hand, the aforementioned charge and discharge time is also within a range of 10 nsec to 10 msec, as is known in the art. This is described in detail in H. Hasegawa and T. Sawada, "Electrical Modeling of Compound Semiconductor Interface for FET Device Assessment", IEEE Transactions on Electron Dev., vol. ED-27, p. 1055 (1980).

On the other hand, the electronic charge and discharge time $\tau_m$ from the gate metal to the interface state is expressed by:

$$\tau_m = (D_S \cdot \Delta\phi_{SS})/(V_{th} \cdot N \cdot T_t) \quad (1),$$

wherein:

$$T_t = \exp[-d \cdot \phi^{\frac{1}{2}} \cdot (m/m_0)^{\frac{1}{2}}] \quad (2).$$

Here:

$D_S$: The interface state density (cm$^{-2}$/eV) of the interface state layer 4;

$\Delta\phi_{SS}$: The shift (eV) of the Fermi level $\phi_{SS}$ of the interface state as a result of the electronic charge and discharge;

$V_{th}$: The velocity (cm/sec) of the free electrons in the gate metal 5;

N: The density (cm$^{-3}$) of the free electrons in the gate metal 5;

$T_t$: The probability (wherein it is assumed for simplicity of discussion to tunnel through a rectangular potential barrier) of tunneling through the insulating film 3;

d: The thickness (Å) of the insulating film 3;

$\phi$: The potential barrier height (eV) by the insulating film 3 for the electrons to tunnel through;

m: The effective mass (g) of an electron in the insulating film 3; and $m_0$: The mass (g) of an electron in a vacuum.

Here, if the typical values of the usual MIS structure, e.g., $D_S \cdot \Delta\phi_{SS} \approx 10^{12}$ cm$^{-2}$, $V_{th} \approx 10^7$ cm/sec, $N \approx 10^{22}$ cm$^{-3}$, $\phi \approx 4$ eV, $m/m_0 \approx 0.2$ or $d \approx 1,000$ Å are substituted into the aforementioned equations (1) and (2), then $$\tau_m \approx 10^{365},$$

and it is found that $\tau_s < < \tau_m$. As a result, the quasithermal equilibrium holds between the interface state and the semiconductor so that the Fermi level of the interface state is pinned to the Fermi level of the semiconductor.

As can be understood from the description made above, therefore, the gate structure may be so made as to satisfy $\tau_s > > \tau_m$ in order that the Fermi level of the interface state may be pinned to that of the second semiconductor.

The aforementioned interface state layer may desirably have an interface state higher than $10^{12}$/cm$^2$/eV at a position corresponding to the energy gap of the aforementioned first semiconductor layer. The interface state layer may preferably have a thickness of 10 to 30 Å.

The interface state layer thus specified can be easily introduced by the mismatching of lattice constantly between the first and second semiconductors, the distortion of stoichiometry due to the hot process during the growth or coverage of the second semiconductor, such an insulator, e.g., an oxide (or an native oxide) of the first (or second) semiconductor as is made by the exposure to the air or water or by the oxygen residing in the growing or covering container during the growth or coverage of the second semiconductor, or the contamination by a trace of metal residing in the interface. More positively, on the other hand, that interface state layer may be formed by means of the plasma oxidation method or anodic oxidation method.

The semiconductor materials conceivable to make up the first semiconductor region and the second semiconductor layer are various. These various materials will be referred to specifically in the Examples of the present invention.

The second semiconductor layer may usually be made of a degenerate semiconductor under such conditions as are known in W. Shockley, "Electrons and Holes in Semiconductors" D. Van Nostrand, Princeton, N.J., 1950. The degenerate conditions of the semiconductor are controlled practically by the concentration of an impurity, as are exemplified in Table 1. Incidentally, according to the above-specified references, the degenerate conditions assume $E_f - E_c = kT$, but the values tabulated are calculated under $E_f - E_c = 2kT$ while retaining an allowance. Here: $E_f$ designates the Fermi level of the semiconductor; $E_c$ the energy at a conduction band edge; k the Boltsmann's constant; and T the absolute temperature.

TABLE 1

|  | Ge | Si | GaAs |
| --- | --- | --- | --- |
| N—Conductivity Type | 4.6 | 12.5 | 0.2 |
| P—Conductivity Type | 2.7 | 4.6 | 3.1 |
|  | ($\times 10^{20}$ cm$^{-3}$) | | |

The second semiconductor may desirably have a thickness larger than 50 Å and is selected to have a thickness ranging from 50 to 5,000 Å, if necessary. Most of the thickness of the second semiconductor to be usually used range from 500 to 3,000 Å.

The following two types can be conceived as the more specific structure of the semiconductor device.

(1) The energy band gap of the second semiconductor layer is larger than the difference between the edge of the energy band in the interface, in which the minority carriers of the first semiconductor layer are present, and the edge of the energy band, in which the majority carriers of the second semiconductor layer are present, and has the same conductivity as that of the first semiconductor layer, and the semiconductor layer between the gate and the source or drain has the conductivity inverse to that of the first semiconductor layer.

The semiconductor device thus constructed can easily form the inversion layer and can allow a large current to flow therethough.

(2) The energy band gap of the second semiconductor layer is larger than the difference between the edge of the energy band in the interface, in which the majority carriers of the first semiconductor layer are present, and the edge of the energy band, in which the majority carriers of the second semiconductor layer are present, and has the conductivity inverse to that of the first semiconductor layer, and the semiconductor layer between the gate and the source or drain has the same conductivity as that of the first semiconductor layer.

The semiconductor device thus constructed can easily form an accumulation layer and can allow a large current to flow therethough.

These two types of the semiconductor devices will be described in the following.

(1) First Type

The field effect transistor of the first type, which has a three-layered structure of the degenerate semiconductor /the interface state layer/ the semiconductor according to the present invention, is shown in section in FIG. 2(a). The band structure of the three-layered structure is shown in FIG. 2(b). As shown: reference numeral 9 indicates a semi-insulating semiconductor substrate (which may be a semiconductor substrate having the same p-type of conductivity as that of a p-type semiconductor layer 11); numeral 10 an n-type semiconductor layer; numeral 12 an interface state layer; numeral 13 a degenerate p-type semiconductor layer (i.e., gate); numeral 14 a source electrode; and numeral 15 a drain electrode. The degenerate semiconductor 13 acts as a gate, and the interface state layer 12 has a thickness of 10 to 30 Å and a interface state density of $10^{12}$ to $10^{13}$/cm$^2$/eV. Between the degenerate semiconductor 13 and the semiconductor 11, moreover, there holds a relationship of $E_g \geq V_{bi}$. Here $E_g$ designates the energy band gap of the degenerate semiconductor, and $V_{bi}$ designates the energy difference between the valence band edge $E_{vm}$ of the degenerate semiconductor 13 and the conduction band edge $E_c$ of the semiconductor 11. Incidentally, it is sufficient that $E_g - V_{bi} = 0.1$ eV.

The degenerate semiconductor 13 is in direct contact with the interface state layer 12, as shown in FIG. 2(b), and its hole concentration is so high as $10^{20}$ cm$^{-3}$ or more so that the charge and discharge time of electrons to the interface state is the shortest for that from the degenerate semiconductor. This will be described specifically in case Si is used as the degenerate semiconductor 13.

The electron charge and discharge time $\tau_m$ from the degenerate Si layer to the interface state can be expressed by the following equations similar to the foregoing equations (1) and (2):

$$\tau_m = (D_S \cdot \Delta \phi_{SS}) / (V_{th} \cdot N \cdot T_t) \tag{3}$$

wherein:

$$T_t = \exp[-d_1 \cdot \phi_1^{\frac{1}{2}} \cdot (m_1/m_0)^{\frac{1}{2}} - d_2 \cdot \phi_2^{\frac{1}{2}} \cdot (m_2/m_0)^{\frac{1}{2}}], \tag{4}$$

$$d_1 = \sqrt{2\epsilon_1(\phi_1 + kt/g \cdot \ln(N/N_{v1}))/qN} \times 10^8. \tag{5}$$

Here:
- $D_S$: The interface state density (cm$^{-2}$/eV) of the interface state layer 12;
- $\Delta \phi_{SS}$: The shift (eV) of the Fermi level $\phi_{SS}$ of the interface state as a result of the electronic charge and discharge;
- $V_{th}$: The velocity (cm/sec) of the free holes in the degenerate Si layer 13;

N: The density (cm$^{-3}$) of the free holes in the degenerate Si layer 13;

$T_t$: The probability (wherein it is also assumed for simplicity of discussion to tunnel through a rectangular potential barrier) of tunneling through the depletion layer 17 formed in the degenerate Si layer 13 and through the interface state layer 12;

$d_1$: The thickness (Å) of the depletion layer 17;

$\phi_1$: The potential barrier height (eV) by the depletion layer 17 for the holes to tunnel through;

$m_1$: The effective mass (g) of a hole in the degenerate Si Layer 13;

$m_0$: The mass (g) of an electron in a vacuum;

$d_2$: The thickness (Å) of the interface state layer 12;

$\phi_2$: The potential barrier height (eV) by the interface state layer 12 for the holes to tunnel through;

$m_2$: The effective mass (g) of a hole in the interface state layer 12;

$\epsilon_1$: The dielectric constant (F/cm) of the degenerate Si layer 13;

k: The Boltzmann's constant (erg/K);

q: The charge (C) of an electron;

T: The absolute temperature (K.); and $N_{v1}$: The effective state density (cm$^{-3}$) of the valence band of the degenerate Si Layer 13.

Here, if it is assumed that: $D_S \Delta \phi_{SS} \approx 10^{12}$ cm$^{-2}$; $V_{th} \approx 10^7$ cm/sec; $\phi_1 \approx 0.45$ eV; $m_1 \approx 0.2 m_0$; $d_2 \approx 10$ Å; $\phi_2 \approx 1$ eV; $m_2 \approx 0.2 m_0$; $\epsilon_1 \approx 11.9 \epsilon_0$ (wherein $\epsilon_0$ designates the dielectric constant in the vacuum: $0.885 \times 10^{-13}$ F/cm); T=300° K.; and $N_{v1} \approx 10^{19}$ cm$^{-3}$, and if the hole density in the degenerate Si layer 13 is set at N=$10^{20}$ cm$^{-3}$, then $d_1$=26 Å; and $\tau_m$=200 ps.

Therefore, the time $\tau_m$ is sufficient short, as compared with the charge and discharge time $\tau_s$ (=10 nsecs to 10 msecs) from the semiconductor layer 11.

As a result, the degenerate semiconductor 13 and the interface state reach the quasi-thermal equilibrium, and the Fermi level $\psi_{SS}$ of the interface state is pinned to the Fermi level $\psi_m$ of the degenerate semiconductor. If a positive voltage is then applied to the gate, the surface potential $\psi_S$ accordingly fluctuates.

On the other hand, the relationship of $E_g \geq V_{bi}$ holds between the degenerate semiconductor 13 and the semiconductor 11 so that a barrier against the electrons in the conduction band of the semiconductor 11 is presnet at the gate side.

As has been described above, the gate structure of the FET according to the first type of the present invention can fluctuate the surface potential $\psi_S$ with the gate voltage, and the barrier against the electrons in the conduction band is present in the interface at the gate side. As a result, the electron inversion layer 16 can be easily formed in the interface so that the FET thus constructed can allow a large current to flow therethrough and can operate at a high speed.

In the description thus far made, the semi conductor and the degenerate semiconductor are of the p-type by way of example. Despite of this fact, however, the inversion layer of holes can be formed in the interface absolutely likewise by the n-type semiconductors.

(2) Second Type

The field effect transistor of the second type, which has a three-layered structure of the degenerate semiconductor /the interface state layer/ the semiconductor according to the present invention, is shown in section in FIG. 3(a). The band structure of the three-layered structure is shown in FIG. 3(b). As shown: reference numeral 40 indicates a semi-insulating semiconductor substrate (which may be a semiconductor substrate having the p-type of conductivity inverse to that of an n-type semiconductor layer (42); numeral 41 a high-density n-type semiconductor layer; numeral 43 an interface state layer; numeral 44 a degenerate p-type semiconductor layer (i.e., gate); numeral 45 a source electrode; and numeral 46 a drain electrode. The degenerate semiconductor 44 acts as a gate, and the interface state layer 43 has a thickness of 10 to 30 Å and a interface state density of $10^{12}$ to $10^{13}$/cm$^2$/eV. Between the degenerate semiconductor 44 and the semiconductor 42, moreover, there holds a relationship of $E_g \geq V_{bi}$. Here, $E_g$ designates the energy band gap of the degenerate semiconductor 44, $V_{bi}$ designates the energy difference between the valence band edge $E_{vm}$ of the degenerate semiconductor 43 and the conduction band edge $E_c$ of the semiconductor 42. Incidentally, it is sufficient that $E_g - V_{bi} = 0.1$ eV.

The degenerate semiconductor 44 is in direct contact with the interface state layer 43, as shown in FIG. 3(b), and its hole concentration is so high as $10^{20}$ cm$^{-3}$ or more so that the charge and discharge time of electrons to the interface state is the shortest for that from the degenerate semiconductor. As a result, the degenerate semiconductor 44 and the interface state reach the quasi-thermal equilibrium, and the Fermi level $\psi_{SS}$ of the interface state is pinned to the Fermi level $\psi_m$ of the degenerate semiconductor. If a positive voltage $V_{gs}$ is then applied to the gate, the surface potential $\psi_S$ accordingly fluctuates.

On the other hand, the relationship of $E_g \geq V_{bi}$ holds between the degenerate semiconductor 44 and the semiconductor 42 so that a barrier against the electrons in the conduction band of the semiconductor 42 is present at the gate side.

As has been described above, the gate structure of the FET according to the second type of the present invention can fluctuate the surface potential $\psi_S$ with the gate voltage $V_{gs}$, and the barrier against the electrons in the conduction band is present in the interface at the gate side. As a result, an electron accumulation layer 47 can be easily formed in the interface so that the FET thus constructed can allow a large current to flow therethrough and can operate at a high speed.

In the description thus far made, the semiconductor 42 is of the n-type and the degenerate semiconductor 44 is of the p-type by way of example. Despite of this fact, however, the accumulation layer of holes can be formed in the interface absolutely likewise even if the semiconductor 42 is of the p-type whereas the degenerate semiconductor 44 is of the n-type.

DESCRIPTION OF THE PREFERRED EMBODIMENTS

EXAMPLE 1

The major steps are shown in FIGS. 4(a) to (d).

Figure 1A:
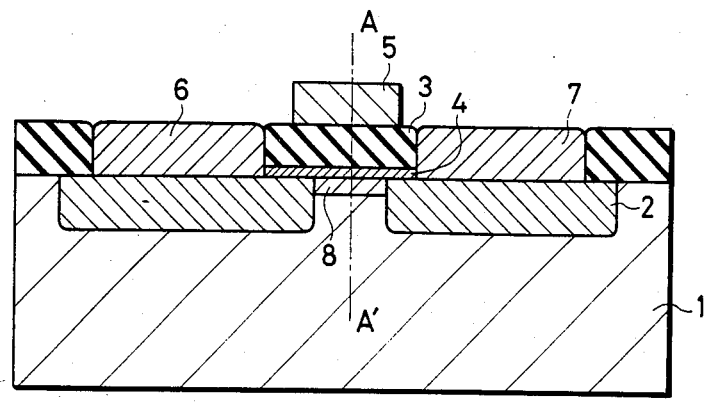
FIG. 1(a) is a sectional view showing the structure of the MISFET.
Figure 1B:
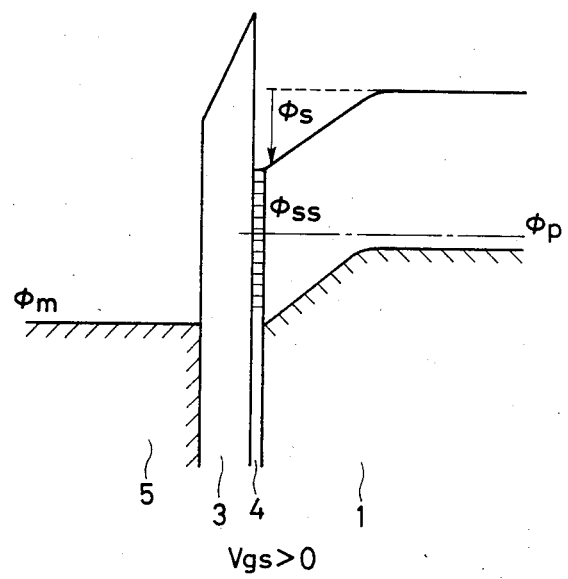
FIG. 1(b) is a diagram showing the band structure taken along line A—A' of FIG. 1(a)
Figure 2A:
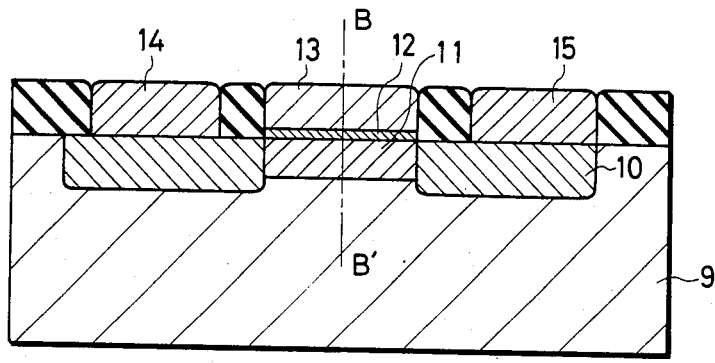
FIG. 2(a) is a sectional view showing the structure of an FET according to the present invention.
Figure 2B:
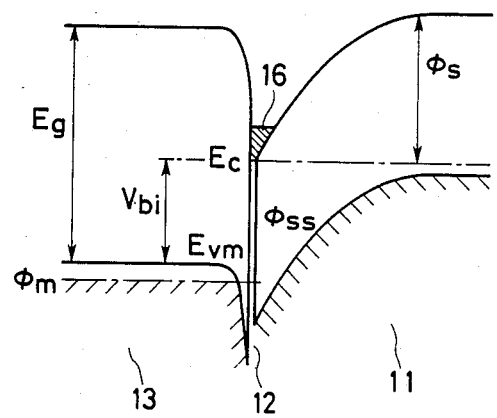
FIG. 2(b) is a diagram showing the band structure taken along line B—B' of FIG. 2(a)
Figure 3A:
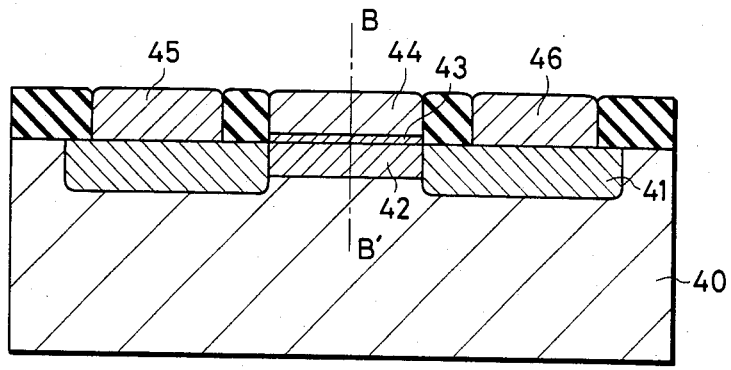
FIG. 3(a) is a sectional view showing the structure of another FET according to the present invention.
Figure 3B:
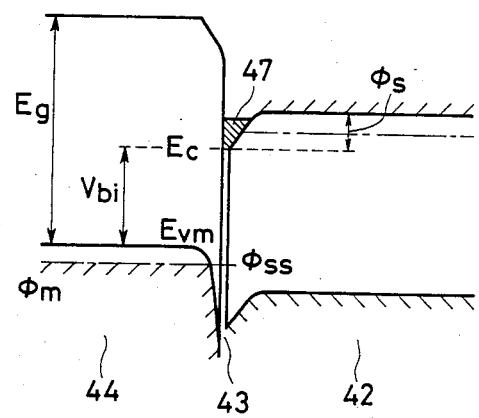
FIG. 3(b) is a diagram showing the band structure taken along line B—B' of FIG. 3(a)
Figure 4A:
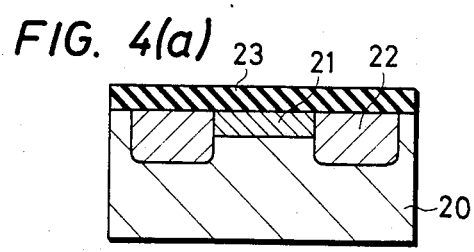
FIGS. 4a-4d, 5a-5c, 6a-6d, 7a-7d, 8a-8d, and 9a-9d are sectional views showing the FET which is being fabricated by a process accorrding to one embodiment of the present invention.

FIG. 4(a): A semi-insulating GaAs substrate 20 was formed thereon with an n-layer 21 and an n+-layer 22 by the selectiv ion implantation of $^{28}Si^+$ and was then subjected to a high temperature annealing (at 800° C. for 20 minutes) for activation with its surface being covered with an $SiO_2$ film 23. The $^{28}Si^+$ implanting conditions were: an implanting energy of 75 KeV and a dosage of $3 \times 10^{12}$ cm$^{-2}$ for the n-layer 21; and an implanting energy 150 KeV and a dosage of $1 \times 10^{13}$ cm$^{-2}$ for the n+-layer 22. The $SiO_2$ 23 had a thickness of 2,000 Å and was deposited by the CVD (i.e., Chemical Vapor Deposition) method. The high temperature annealing was conducted at 800° C., for 20 minutes and in the atmosphere of $H_2$.

Figure 4B:
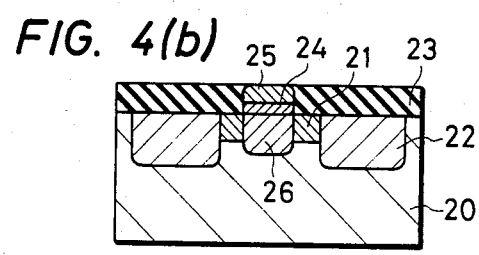

FIG. 4(b): The $SiO_2$ film 23 used in the high temperature annealing had its gate portion etched off. After the exposure to the air was conducted for a long time to form an interface state layer 24 having a thickness of 10 to 30 Å by the native oxide film of GaAs, and then a degenerate p-$Ga_{0.7}Al_{0.3}As$ layer 25 was formed through the selective epitaxial growth only in the removed region by the MOCVD (i.e., Metal Organic Chemical Vapor Deposition) method. The p-$Ga_{0.7}Al_{0.3}As$ layer 25 had its impurity concentration set at $20^{20}$ to $10^{21}$ cm$^{-3}$ so as to satisfy the degenerate condition. The impurity used at that time was Zn, and the growing temperature by the MOCVD method was 680° C. so that the n-layer just below the p-$Ga_{0.7}Al_{0.3}As$ layer 25 was completely compensated by the diffusion of Zn to form a p-GaAs layer 26. After the $SiO_2$ film of the gate portion had been removed, moreover, exposure to the air was conducted for a long time to form the surface of the GaAs substrate with the native oxide film of GaAs having a thickness of 10 to 30 Å and a high-density state in the band gap in GaAs. As the p-$Ga_{0.7}Al_{0.3}As$ layer was made to grow thereon, the interface stae layer 24 was formed in high density in the interface between the p-$Ga_{0.7}Al_{0.3}As$ layer 25 and the p-GaAs layer 26.

Figure 4C:
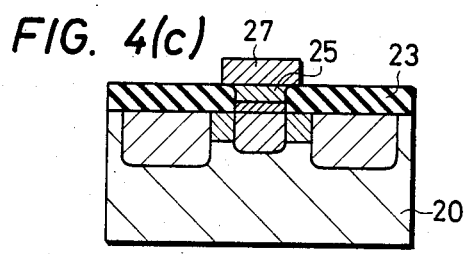

FIG. 4(c): AuGe/Ni/Au were deposited in the recited order to have thicknesses of 600 Å, 100 Å and 800 Å, and the metal in the region other than the gate portion was removed by the ion milling method to form a gate electrode 27.

Figure 4D:
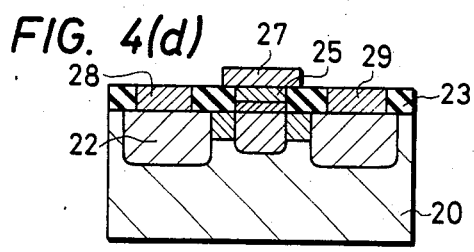

FIG. 4(d): After an electrode pattern had been formed by means of a photo resist (e.g., AZ1350J), the $SiO_2$ film of the pattern portion was removed, and AuGe/Ni/Au were deposited on the whole surface. Then, the unnecessary metal was removed (by the lift-off method) together with the photo resist to form source and drain electrodes 28 and 29. The metal cover films had thicknesses of AuGe 600 Å, Ni 100 Å, and Au 800 Å. After that, a heat treatment was conducted at 400° C., for three minutes and in the atmosphere of $H_2$. At this time, the ohmic contact with the p-$Ga_{0.7}Al_{0.3}As$ layer 25 was realized together with the ohmic contact with the n+-layer 22.

According to the present Example, the electron inversion layer was easily formed at a gate voltage higher than 0.8 V in the interface between the p-$Ga_{0.7}Al_{0.3}As$ layer and the p-GaAs layer. As compared with the MISFET of the prior art, a current as large as three times or more could be allowed to flow at the common gate voltage, and the transconductance obtained was $g_m = 400$ mS/mm. At the same time, there were confirmed improved effects that the interface state had a short charge and discharge time and that the dependencies of the mutual conductance and the capacitance upon the frequency were low.

In the present Examples, both the degenerate semiconductor and the semiconductor were of the p-type, and the semiconductor between the gate and the source or drain was of the n-type. Even in the contrary case, however, or in case both the degenerate semiconductor and the semiconductor were of the n-type whereas the semiconductor between the gate and the source or drain was of the p-type, the inversion layer of holes could likewise be formed to allow a large current to flow.

In the present Example, on the other hand, GaAs was used as the semiconductor, and $Ga_{0.7}Al_{0.3}As$ was used as the degenerate semiconductor. Despite of this fact, however, the object could be sufficiently achieved even if semiconductors as enumerated in the following Table 2 were used.

TABLE 2

| 1st Semiconductor | Interface State Layer (Thickness) | 2nd Semiconductor (Thickness) |
| --- | --- | --- |
| GaAs | Plasma Oxide Film (30 Å) | $Ga_{0.7}Al_{0.3}As$ (2,000 Å) |
| InP | Plasma Oxide Film (25 Å) | $In_{0.84}Ga_{0.16}As_{0.35}P_{0.63}$ (2,000 Å) |
| Ge | Anodic Oxide Film (15 Å) | GaAs (2,000 Å) |
| Si | Native Oxide Film (25 Å) | GaP (2,000 Å) |

Moreover, it was possible to realize an improvement in the performance three times or more even in the case of the FET which was fabricated by arbitrarily selecting one of Si, Ge, GaAs and InP substrates as the semiconductor and one of the following substances as the degenerate semiconductor:

Si, BP, AlP, AlAs, AlSb, GaN, GaP, GaAs, GaSb, InN, InP, $Al_xIn_{1-x}P$ ($0 < x < 1$),
$Al_xGa_{1-x}As$ ($0 < x < 1$),
$Al_xIn_{1-x}As$ ($0.2 \leq x < 1$),
$Al_xGa_{1-x}Sb$ ($0 < x < 1$),
$Al_xIn_{1-x}Sb$ ($0.4 \leq x < 1$),
$Ga_xIn_{1-x}P$ ($0 < x < 1$),
$Ga_xIn_{1-x}As$ ($0.4 \leq x < 1$),
$GaP_xAs_{1-x}$ ($0 < x <$),
$GaAs_xSb_{1-x}$ ($0.8 \leq x < 1$),
$InP_xAs_{1-x}$ ($0.4 \leq x < 1$),
$Al_xGa_{1-x}P_yAs_{1-y}$ ($0 < x < 1$, $0 < y < 1$),
$Al_xGa_{1-x}As_ySb_{1-y}$ ($0 < x < 1$, $0 < y < 1$),
$Ga_xIn_{1-x}P_yAs_{1-y}$ ($0.4 \leq x < 1$, $0.4 \leq y < 1$),
$Ga_xIn_{1-x}As_ySb_{1-y}$ ($0.7 \leq x < 1$, $0.7 \leq y < 1$),
$(Al_xGa_{1-x})_yIn_{1-y}P$ ($0 < x < 1$, $0 < y < 1$),
$(Al_xGa_{1-1})_yIn_{1-y}As$ ($0 < x < 1$, $0.5 \leq y < 1$),
$(Al_xGa_{1-x})_yIn_{1-y}Sb$ ($0.5 \leq x < 1$ and $0.5 \leq y < 1$,
  $0.4 \leq x < 0.5$ and $0.6 \leq y < 1$,
  $0.3 \leq x < 0.4$ and $0.7 \leq y < 1$,
  or $0.2 \leq x < 0.3$ and $0.8 \leq y < 1$),
$In(P_xAs_{1-x})_ySb_{1-y}$ ($0.6 \leq x < 1$).

In FIG. 4(b), on the other hand, the interface state layer was formed by the exposure to the air for the long time. Alternatively, the interface state layer was formed by oxidizing the surface of GaAs to a thickness of 10 to 30 Å by the plasma oxidation method or anodic oxidation method. As a result, the electron inversion layer was formed like the FET by the aforementioned fabricating method of the exposure to the air so that a current as large as three times or more could be allowed to flow.

EXAMPLE 2

Figure 5A:
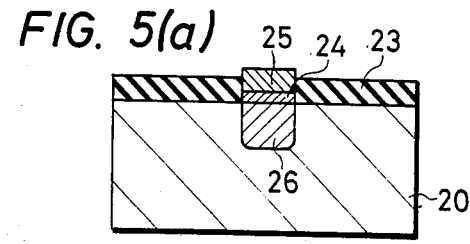
Figure 5B:
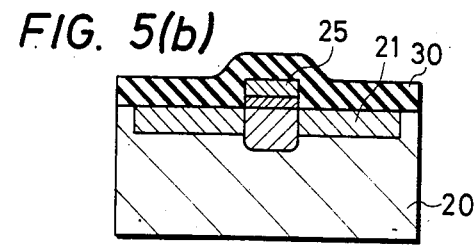
Figure 5C:
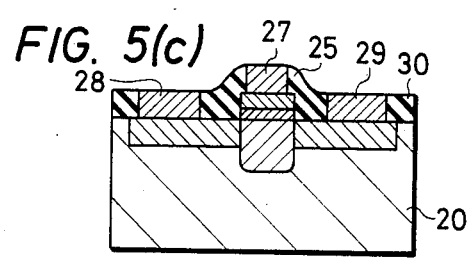

The major steps are shown in FIGS. 5(a) to (c).

FIG. 5(a): the semi-insulating GaAs substrate 20 was covered all over its surface with the $SiO_2$ film 23, and this $SiO_2$ film 23 at the gate portion was removed. After this exposure to the air was conducted for a long time to form an interface state layer 24 having a thickness of 10 to 30 Å by the native oxide film of GaAs, and then a degenerate p-$Ga_{0.7}Al_{0.3}As$ layer 25 was formed through the selective epitaxial growth only in the removed region by the MOCVD method. The p-$Ga_{0.7}Al_{0.3}As$ layer 25 had its impurity concentration set at $20^{20}$ to $10^{21}$ cm$^{-3}$ so as to satisfy the degenerate condition. The impurity used was Zn, and the growing temperature by the MOCVD method was 680° C. so that the Zn diffused into the GaAs to change the GaAs just below the p-$Ga_{0.7}Al_{0.3}As$ layer 25 into the p-GaAs layer 26.

FIG. 5(b): The $SiO_2$ film 23 used for the selective growth was removed away, and $^{28}Si^+$ ions were selectively implanted by using the remaining p-$Ga_{0.7}Al_{0.3}As$ layer 25 as a mask to form the n-GaAs layer 21 in the region adjacent to the gate. At this time, the $^{28}Si^+$ ions were not implanted just below the p-$Ga_{0.7}Al_{0.3}As$ layer 25. After this, a high temperature annealing was again conducted for activation in the state having the coverage of an $SiO_2$ film 30 of 2,000 Å. The $^{28}Si^+$ implanting conditions were the implanting energy of 75 KeV and the dosage of $1\times10^{13}$ cm$^{-2}$, and the high temperature annealing was conducted at 800° C., for 20 minutes and in the atmosphere of $H_2$.

FIG. 5(c): After an electrode pattern had been formed by means of a photo resist (e.g., AZ1350J), the $SiO_2$ film 30 of the pattern portion was removed, and AuGe/Ni/Au were deposited on the whole surface. Then, the unnecessary metal was removed (by the lift-off method) together with the photo resist to form the gate electrode 27 and the source and drain electrodes 28 and 29. The metal cover films had thicknesses of AuGe 600 Å, Ni 100 Å, and Au 800 Å. After that, a heat treatment was conducted at 400° C., for three minutes and in the atmosphere of $H_2$. At this time, the source-drain and the gate were brought into ohmic contact.

According to the present Example, one of the steps necessary for the photo mask could be omitted. Moreover, the n-layer between the gate-source and the drain was formed in the high dosage of $1\times10^{13}$ cm$^{-2}$ so that the FET of the present Example could allow a current four times or more as high as that of the MISFET of the prior art to flow and could attain a transconductance of 550 mS/mm.

EXAMPLE 3

The major steps are shown in FIGS. 6(a) to (d).

Figure 6A:
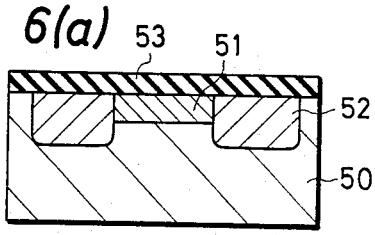

FIG. 6(a): A semi-insulating GaAs substrate 50 was formed thereon with an n-layer 51 and an n+-layer 52 by the selective ion implantation of $^{28}Si^+$ and was then subjected to a high temperature annealing for activation with its surface being covered with an $SiO_2$ film 53. The $^{28}Si^+$ implanting conditions were: an implanting energy of 75 KeV and a dosage of $3\times10^{12}$ cm$^{-2}$ for the n-layer 51; and an implanting energy 150 KeV and a dosage of $1\times10^{13}$ cm$^{-2}$ for the n+-layer 52. The impurity concentration of the n-layer 51 was usually selected at a value within a range of $10^{16}$ to $10^{18}$ cm$^{-3}$ in accordance with the element characteristics desired. The $SiO_2$ 53 had a thickness of 2,000 Å and was deposited by the CVD (i.e., Chemical Vapor Deposition) method. The high temperature annealing was conducted at 800° C., for 20 minutes and in the atmosphere of $H_2$.

Figure 6B:
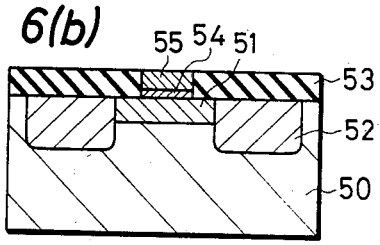

FIG. 6(b): The $SiO_2$ film 53 used in the high temperature annealing had its gate portion etched off. After this exposure to the air was conducted for a long time to form an interface state layer 54 having a thickness of 10 to 30 Å by the native oxide film of GaAs, and then a degenerate p-$Ga_{0.7}Al_{0.3}As$ layer 55 was formed through the selective epitaxial growth only in the removed region by the MOCVD (i.e., Metal Organic Chemical Vapor Deposition) method. The p-$Ga_{0.7}Al_{0.3}As$ layer 55 had its impurity concentration set at $20^{20}$ to $10^{21}$ cm$^{-3}$ so as to satisfy the degenerate condition. Since the impurity used at this time was Zn, its diffusion was fast in the case of the growth temperature of 680° C. by the MOCVD method used in the present Example. Therefore, the undoped $Ga_{0.7}Al_{0.3}As$ was first made to grow to 1,000 Å and the p-$Ga_{0.7}Al_{0.3}As$ was then made to grow to 1,000 Å. As a result of the diffusion of Zn during the growth of the p-$Ga_{0.7}Al_{0.3}As$, the undoped $Ga_{0.7}Al_{0.3}As$ was wholly changed to have the p-type conductivity thereby to form the p-$Ga_{0.7}Al_{0.3}As$ layer 55. After the $SiO_2$ film of the gate portion had been removed, moreover, exposure to the air was conducted for a long time to form the surface of the GaAs substrate with the native oxide film of GaAs having a thickness of 10 to 30 Å and a high-density state in the band gap in GaAs. As the p-$Ga_{0.7}Al_{0.3}As$ layer 55 was made to grow thereon, the interface state layer 54 was formed in high density in the interface between the p-$Ga_{0.7}Al_{0.3}As$ layer 55 and the n-GaAs layer 51.

Figure 6C:
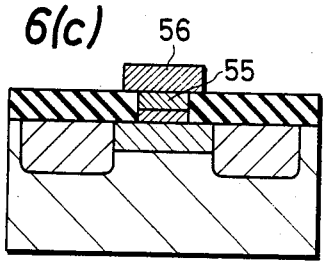

FIG. 6(c): AuGe/Ni/Au were deposited in the recited order to have thicknesses of 600 Å, 100 Å and 800 Å, and the metal in the region other than the gate portion was removed by the ion milling method to form a gate electrode 56.

Figure 6D:
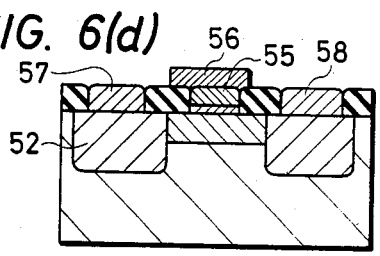

FIG. 6(d): After an electrode pattern had been formed by means of a photo resist (e.g., AZ1350J), the $SiO_2$ film of the pattern portion was removed, and AuGe/Ni/Au were deposited on the whole surface. Then, the unnecessary metal was removed (by the lift-off method) together with the photo resist to form source and drain electrodes 57 and 58. The metal cover films had thicknesses of AuGe 600 Å, Ni 100 Å, and Au 800 Å. After that, a heat treatment was conducted at 400° C., for three minutes and in the atmosphere of $H_2$. At this time, the ohmic contact with the p-$Ga_{0.7}Al_{0.3}As$ layer 55 was realized together with the ohmic contact with the n+-layer 52.

According to the present Example, the electron accumulation layer was easily formed at a gate voltage higher than 0.8 V in the interface between the p-$Ga_{0.7}Al_{0.3}As$ layer and the p-GaAs layer. As compared with the MISFET of the prior art, a current as large as three times or more could be allowed to flow at the common gate voltage, and the transconductance obtained was $g_m=400$ mS/mm. At the same time, there were confirmed improved effects that the interface state had a short charge and discharge time and that the dependencies of the transductance and the capacitance upon the frequency were low.

In the present Example, the degenerate semiconductor was of the p-type and the semiconductor was of the n-type, and the semiconductor between the gate and the source of drain was of the n-type. Even in the contrary case, however, or in case the degenerate semiconductor was of the n-type and both the semiconductor and the semiconductor between the gate and the source or drain were of the p-type, the accumulation layer of holes could likewise be formed to allow a large current to flow.

In the present Example, on the other hand, GaAs was used as the semiconductor, and $Ga_{0.7}Al_{0.3}As$ was used as the degenerate semiconductor. Despite of this fact, however, it was possible to realize an improvement in the performance three times or more even in the case of the FET which was fabricated by arbitrarily selecting one of Si, Ge, GaAs and InP substrates as the semiconductor and one of the following substances as the degenerate semiconductor:

Si, BP, AlP, AlAs, AlSb, GaN, GaP, GaAs, GaSb, InN, InP,
$Al_xIn_{1-x}P$ $(0<x<1)$,
$Al_xGa_{1-x}As$ $(0<x<1)$,
$Al_xIn_{1-x}As$ $(0.2 \leq x<1)$,
$Al_xGa_{1-x}Sb$ $(0<x<1)$,
$Al_xIn_{1-x}Sb$ $(0.4 \leq x<1)$,
$Ga_xIn_{1-x}P$ $(0<x<1)$,
$Ga_xIn_{1-x}As$ $(0.4 \leq x<1)$,
$GaP_xAs_{1-x}$ $(0<x<1)$,
$GaAs_xSb_{1-x}$ $(0.8 \leq x<1)$,
$InP_xAs_{1-x}$ $(0.4 \leq x<1)$,
$Al_xGa_{1-x}P_yAs_{1-y}$ $(0<x<1, 0<y<1)$,
$Al_xGa_{1-x}As_ySb_{1-y}$ $(0<x<1, 0<y<1)$,
$Ga_xIn_{1-x}P_yAs_{1-y}$ $(0.4 \leq x<1, 0.4 \leq y<1)$,
$Ga_xIn_{1-x}As_ySb_{1-y}$ $(0.7 \leq x<1, 0.7 \leq y<1)$,
$(Al_xGa_{1-x})_yIn_{1-y}P$ $(0<x<1, 0<y<1)$,
$(Al_xGa_{1-x})_yIn_{1-y}As$ $(0<x<1, 0.5 \leq y<1)$,
$(Al_xGa_{1-x})_yIn_{1-y}Sb$ $(0.5 \leq x<1$ and $0.5 \leq y<1$,
 $0.4 \leq x<0.5$ and $0.6 \leq y<1$,
 $0.3 \leq x<0.4$ and $0.7 \leq y<1$,
 or $0.2 \leq x<0.3$ and $0.8 \leq y<1)$,
$In(P_xAs_{1-x})_ySb_{1-y}$ $(0.6 \leq x<1)$.

In FIG. 6(b), on the other hand, the interface state layer was formed by the exposure to the air for the long time. Alternatively, the interface state layer was formed by oxidizing the surface of GaAs to a thickness of 10 to 30 Å by the plasma oxidation method or anodic oxidation method. As a result, the electron accumulation layer was formed like the FET by the aforementioned fabricating method of the exposure to the air so that a current as large as three times or more could be allowed to flow.

EXAMPLE 4

The major steps are shown in FIGS. 7(a) to (d).

Figure 7A:
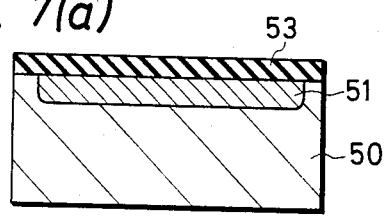

FIG. 7(a): A semi-insulating GaAs substrate 50 was formed thereon with an n-layer 51 by the selective ion implantation of $^{28}Si^+$ and was then subjected to a high temperature annealing for activation with its surface being covered with an $SiO_2$ film 53. The $^{28}Si^+$ implanting conditions were: an implanting energy of 75 KeV and a dosage of $3 \times 10^{12}$ cm$^{-2}$. The $SiO_2$ 53 had a thickness of 2,000 Å and was applied by the CVD method. The hot heat treatment was conducted at 800° C., for 20 minutes and in the atmosphere of $H_2$.

Figure 7B:
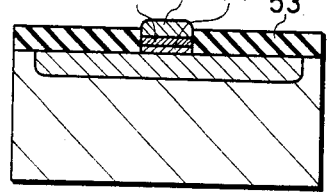

FIG. 7(b): The $SiO_2$ film 53 used in the high temperature annealing had its gate portion etched off. After the exposure to the air was conducted for a long time to form an interface state layer 54 having a thickness of 10 to 30 Å by the native oxide film of GaAs, and then a degenerate $p-Ga_{0.7}Al_{0.3}As$ layer 55 was formed through the selective epitaxial growth only in the removed region by the MOCVD method. The $p-Ga_{0.7}Al_{0.3}As$ layer 55 had its impurity concentration set at $10^{20}$ to $10^{21}$ cm$^{-3}$ so as to satisfy the degenerate condition. Since the impurity used at this time was Zn, its diffusion was fast in the case of the growth temperature of 680° C. by the MOCVD method used in the present Example. Therefore, the undoped $Ga_{0.7}Al_{0.3}As$ was first made to grow to 1,500 Å, and the $p-Ga_{0.7}Al_{0.3}As$ was then made to grow to 500 Å. As a result of the diffusion of Zn during the growth of the $p-Ga_{0.7}Al_{0.3}As$, the undoped $Ga_{0.7}Al_{0.3}As$ was partially changed to have the p-type conductivity to leave an undoped $Ga_{0.d}Al_{0.3}As$ layer 59.

Figure 7C:
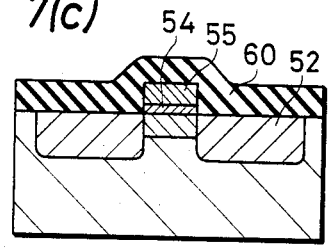

FIG. 7(c): The $SiO_2$ film 53 used for the selective growth was removed away, and $^{28}Si^+$ ions were selectively implanted by using the remaining $p-Ga_{0.7}Al_{0.3}As$ layer 55 as a mask to form the $n^+-GaAs$ layer 52 in the region adjacent to the gate. At this time, the $^{28}Si^+$ ions were not implanted into the GaAs just below the $p-Ga_{0.7}Al_{0.3}As$ layer 25. After this, a high temperature annealing was again conducted for activation in the state having the coverage of an $SiO_2$ film 60 of 2,000 Å. The $^{28}Si^+$ implanting conditions were the implanting energy of 150 KeV and the dosage of $1 \times 10^{13}$ cm$^{-2}$, and the high temperature annealing was conducted at 800° C., for 20 minutes and in the atmosphere of $H_2$. During this heat treatment, the undoped $Ga_{0.7}Al_{0.3}As$ layer 59 of FIG. 7(b) had its conductivity changed to the p-type as a result of the diffusion of Zn to form the $p-Ga_{0.7}Al_{0.3}As$ layer 55, as shown in FIG. 7(c).

Figure 7D:
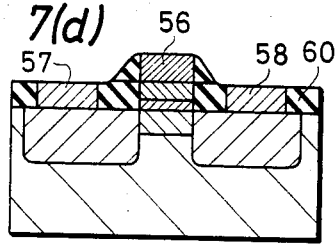

FIG. 7(d): After an electrode pattern had been formed by means of a photo resist (e.g., AZ1350J), the $SiO_2$ film 60 of the pattern portion was removed, and AuGe/Ni/Au were deposited on the whole surface. Then, the unnecessary metal was removed (by the lift-off method) together with the photo resist to form the gate electrode 56 and the source and drain electrodes 57 and 58. The metal cover films had thicknesses of AuGe 600 Å, Ni 100 Å, and Au 800 Å. After that, a heat treatment was conducted at 400° C., for three minutes and in the atmosphere of $H_2$. At this time, the ohmic contact was taken between the source—drain and the gate.

Since the $n^+$-layer between the gate and the source or drain was formed in the high dosage of $1 \times 10^{13}$ cm$^{-2}$ according to the present Example, the parasitic resistance was dropped so that a current four times or more as large as that of the MISFET of the prior art could flow. Moreover, transconductance obtained was 540 mS/mm.

EXAMPLE 5

The major steps are shown in FIGS. 8(a) to (d).

Figure 8A:
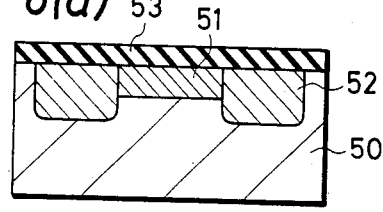

FIG. 8(a): The n-layer 51 and the $n^+$-layer 52 were formed like the step (a) of the Example 3.

Figure 8B:
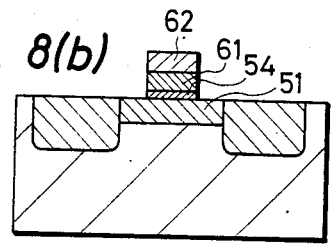

FIG. 8(b): After removal of the $SiO_2$ film 53, a Si film 61, which had been doped with boron as an impurity, was deposited by the plasma CVD method, and a W film 62 was then deposited by the sputtering method. After the subsequent patterning step by a photo resist, the W film 62 and the Si film 61 were subjected to a dry-etching treatment by a mixed gas of $CF_4$ and $O_2$ to form a gate electrode. Here, the Si film 61 had a thickness of 3,000 Å, and the W film 62 had a thickness of 1,000 Å. The coverage of the W film 62 and the setting of the thickness of the Si film 61 at 3,000 Å were merely intended to reduce the gate resistance but are not essential. The Si film 61 may be 50 Å at the minimum so as to play a role as the gate electrode.

Moreover, it is customary to expose the surface of the n-layer 51 to the air or water at usual step from the removal of the SiO$_2$ film 53 to the coverage of the Si film 61. As a result, a native oxide film of 10 Å was formed on the surface of the n-layer 51. As a result, the interface state layer 54 was formed in the interface between the n-layer 51 and the Si film 61. Thanks to the mismatching of the lattice constant between the Si film 61 and the GaAs, moreover, the interface state was introduced more easily.

The Si film 61 according to the present Example was formed at a substrate temperature of 200° C., at the flow rate ratio of 4:10 of B$_2$H$_6$ to SiH$_4$, with an RF power of 100 W and under a pressure of 1 Torr. According to that substrate temperature, the Si film 61 formed was in an amorphous state. According to the flow rate ratio of B$_2$H$_6$ to Si$_4$, the boron to be activated at the subsequent high temperature annealing step was $10^{20}$ cm$^{-3}$ or more.

Figure 8C:
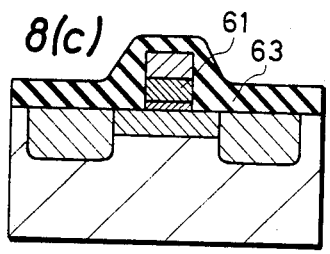

FIG. 8(c): After deposition of a SiO$_2$ film 63 of 2,000 Å, another annealing at 800° C. and for 20 minutes was conducted in the atmosphere of H$_2$. As a result of this high temperature annealing, the Si film 55 was changed into a polycrystalline state and the boron contained in the film was electrically activated. As a result, the Si film 61 became a polycrystalline film having the p-type conductivity, and the electrically active boron concentration was $10^{20}$ cm$^{-3}$. In order to realize the p-type conductivity, the boron was added in the present Example. It goes without saying that the p-type conductivity can be realized even if gallium or aluminum is added. The additions of the boron and the gallium or aluminum can be easily effected by the P-CVD method or the MDE method, respectively.

Figure 8D:
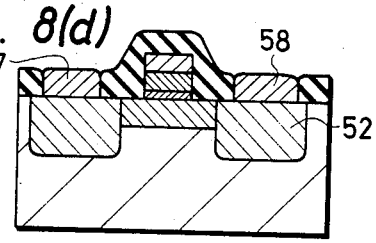

FIG. 8(d): After an electrode pattern had been formed by means of a photo resist, the SiO$_2$ film of the pattern portion was removed, and AuGe/Ni/Au were deposited on to the whole surface. Then, the unnecessary metal was removed (by the lift-off method) together with the photo resist to form the source and drain electrode 57 and 58. The metal cover films had thicknesses of AuGe 600 Å, Ni 100 Å, and Au 800 Å. After that, a heat treatment was conducted at 400° C., for three minutes and in the atmosphere of H$_2$. At this time, the ohmic contact with the n$^+$-layer 52 was realized.

Effects similar to those of the foregoing Examples could be attained in the present Example.

EXAMPLE 6

The major steps are shown in FIGS. 9(a) to (d). The present Example was characterized by the step at which the n$^+$-layer was formed in self-alignment by using as a mask the Si film used as the gate electrode.

Figure 9A:
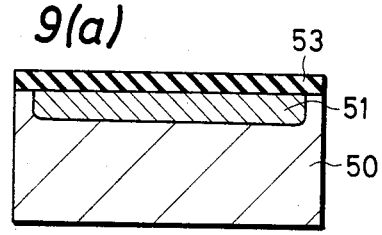

FIG. 9(a): The n-layer 51 was formed like the step (a) of the Example 4.

Figure 9B:
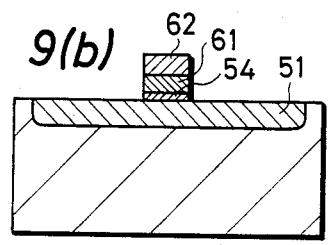

FIG. 9(b): After removal of the SiO$_2$ film 53, the Si film 61 doped with boron as an impurity was deposited by the plasma CVD method, and the W film 62 was then deposited by the sputtering method. After the subsequent patterning by a photo resist, the W film 62 and the Si film 61 were dry-etched by the mixed gas of CF$_4$ and O$_2$ to form the gate electrode. Here, the Si film 61 had a thickness of 3,000 Å, and the W film 62 had a thickness of 1,000 Å. The film thickness of the two layered films, i.e., those two films, was determined in accordance with the $^{28}$Si$^+$ ion implanting energy to be used subsequently for forming the n$^+$ layer. On the other hand, the Si film 61 may have a thickness of 50 Å at a minimum so as to satisfy the role as the gate electrode.

As has been described in the Example 5, the n-layer 51 had its surface formed with the native oxide film of 10 Å. As a result, the interface state layer 54 was formed in the interface between the n-layer 51 and the Si film 61. On the other hand, the forming condition of the Si film 61 was similar to that of the Example 5.

Figure 9C:
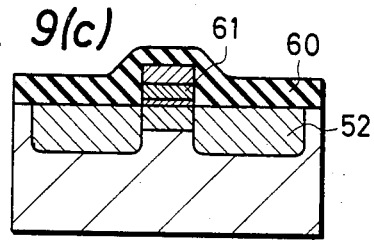

FIG. 9(c): The two layered films, i.e., the Si film 61 and the W film 62 were used as a mask to selectively implant the $^{28}$Si$^+$ ions to change the region adjacent to the gate into the n$^+$-GaAs layer 52. At this time, the $^{28}$Si$^+$ ions were not implanted into the GaAs just below the two layered films. After that, the n$^+$-layer 52 was again activated by the high temperature annealing with the coverage of the SiO$_2$ film 60 of 2,000 Å. The $^{28}$Si$^+$ implanting conditions were the implanting energy of 150 KeV and the dosage of $1\times10^{13}$ cm$^{-2}$, and the high temperature annealing was conducted at 800° C., for 20 minutes and in the atmosphere of H$_2$. By this high temperature annealing, the Si film 61 was changed into a polycrystal and the boron contained therein was electrically activated. As a result, the Si film 61 became a polycrystalline film having the p-type of conductivity and the concentration of the electrically active boron was $10^{20}$ cm$^{-3}$.

Figure 9D:
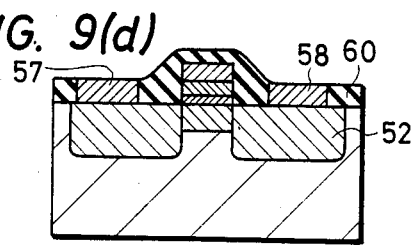

FIG. 9(d): The source-drain electrodes were formed like the step (d) of the Example 4.

Effects similar to those of the foregoing Examples could be attained in the present Example.

Incidentally, in case the gate electrode is made of a semiconductor belonging to III-V group, the high temperature annealing step of FIG. 8(c) can be omitted from the element in which the n$^+$ layer 52 is not formed in self-alignment, as in the Example 5. This is because, in case AlGaAs, for example, is used as the gate electrode, the growth can usually be effected by the MOCVD or MBE method, according to which the film has already become a polycrystal or a single crystal during its growth.

On the contrary, in the element having the n$^+$-layer 52 formed in self-alignment with the gate, as in the present Example, the high temperature annealing step of FIG. 9(c) cannot be omitted. The impurity for doping the gate electrode into the p-type of conductivity could be an acceptor for the GaAs if the gate electrode is made of a semiconductor belonging to the III-V group such as AlGaAs. As a result, the impurity in the gate electrode is caused to diffuse into the GaAs side by the high temperature annealing, which is contained in the step of FIG. 9(c) for activating the n$^+$-layer, thereby to cause fluctuations in the carrier concentration in the n-GaAs layer 51. These fluctuations are generally fatal to the fabrication of a highly integrated circuit in which it is important to precisely realize the carrier concentration control.

In case the Si film is used as the gate electrode, as in the present Example, the impurity doping the Si film is an element of a III group such as boron or gallium so that it acts as neither an acceptor nor a donor in the GaAs. As a result, the high temperature annealing will not cause the fluctuations in the carrier concentration. Therefore, especially the Si film is useful in the element which uses the semiconductor substrate belonging to the III-V group and experiences the high temperature annealing step, as in the present Example.

What is claimed is:

1. A semiconductor device comprising: control means including an interface state layer on a first semiconductor layer having a first type of conductivity, and a second semiconductor layer on said interface state layer, said second semiconductor layer being made of a degenerate semiconductor; and carrier donating and accepting means sandwiching said control means inbetween, said interface state layer having its Fermi level pinned to the Fermi level of said second semiconductor layer.

2. A semiconductor device according to claimm1, wherein said interface state layer has an interface state higher than $10^{12}/cm^2/eV$ at a position corresponding to the energy gap of said first semiconductor layer.

3. A semiconductor device according to claim 2, wherein said interface state layer has a thickness within a range of 10 to 30 Å.

4. A semiconductor device according to claim 1, wherein said second semiconductor layer has an energy band gap larger than the difference between the edge of the energy band of the interface of said first semiconductor layer, in which minority carriers are present, and the edge of the energy band of said second semiconductor layer, in which majority carriers are present, and the same conductivity as that of said first semiconductor layer and there exists a semiconductor layer having the conductivity inverse to that of said first semiconductor layer between said control means and said carrier donating and accepting means.

5. A semiconductor device according to claim 1, wherein said second semiconductor layer has an energy band gap larger than the difference between the edge of the energy band of the interface of said first semiconductor layer, in which majority carriers are present, and the edge of the energy band of said second semiconductor layer, in which majority carriers are present, and the conductivity inverse to that of said first semiconductor layer, and there exists a semiconductor layer having the same conductivity as that of said first semiconductor layer between said control means and said carrier donating and accepting means.

6. A semiconductor device according to claim 1, wherein said first semiconductor layer is made of a compound semiconductor belonging to a III-V group.

7. A semiconductor device according to claim 6, wherein said second semiconductor layer is made of Si.

8. A semiconductor device according to claim 3, wherein the second semiconductor layer has a thickness of 50 to 5,000 Å.

9. A semiconductor device according to claim 1, wherein said semiconductor device is a field effect semiconductor device, said control means comprising a gate of the device.

10. A semiconductor device according to claim 1, wherein the energy band gap of the second semiconductor layer is greater than or equal to the energy difference between the valence band edge of the second semiconductor layer and the conduction band edge of the first semiconductor region.

11. A semiconductor device according to claim 1, wherein the second semiconductor layer is in direct contact with the interface state layer.

12. A semiconductor device according to claim 1, wherein said interface state layer has a thickness within a range of 10 to 30 Å.

13. A semiconductor device comprising: control means including an interface state layer on a first semiconductor layer having a first type of conductivity, and a second semiconductor layer on said interface state layer; and carrier donating and accepting means sandwiching said control means inbetween, said interface state layer being an oxide layer and having its Fermi level pinned to the Fermi level of said second semiconductor layer.

* * * * *